United States Patent
Duggal et al.

(10) Patent No.: US 6,515,417 B1
(45) Date of Patent: Feb. 4, 2003

(54) ORGANIC LIGHT EMITTING DEVICE AND METHOD FOR MOUNTING

(75) Inventors: Anil Raj Duggal, Niskayuna, NY (US); Richard Joseph Saia, Niskayuna, NY (US); Paul Alan McConnelee, Schenectady, NY (US); Larry Gene Turner, Galway Lake, NY (US)

(73) Assignee: General Electric Company, Niskayuna, NY (US)

( * ) Notice: Subject to any disclaimer, the term of this patent is extended or adjusted under 35 U.S.C. 154(b) by 236 days.

(21) Appl. No.: 09/592,078

(22) Filed: Jun. 12, 2000

Related U.S. Application Data

(60) Provisional application No. 60/178,451, filed on Jan. 27, 2000, and provisional application No. 60/194,068, filed on Mar. 31, 2000.

(51) Int. Cl.⁷ .............................................. H01J 63/04
(52) U.S. Cl. ...................................... 313/506; 313/504
(58) Field of Search .................................. 313/503, 504, 313/506, 512, 510, 505; 345/45, 76

(56) References Cited

U.S. PATENT DOCUMENTS

| | | | | |
|---|---|---|---|---|
| 3,886,388 | A | * 5/1975 | Paine, Jr. et al. | 313/177 |
| 4,603,496 | A | * 8/1986 | Latz et al. | 40/547 |
| 5,247,190 | A | 9/1993 | Friend et al. | 257/40 |
| 5,294,870 | A | 3/1994 | Tang et al. | 313/504 |
| 5,346,776 | A | * 9/1994 | Taniguchi et al. | 428/690 |
| 5,644,327 | A | 7/1997 | Onyskevych et al. | 345/80 |
| 5,703,436 | A | * 12/1997 | Forrest et al. | 313/506 |
| 5,708,130 | A | 1/1998 | Woo et al. | 528/397 |
| 5,747,363 | A | * 5/1998 | Wei et al. | 438/5 |
| 5,757,128 | A | * 5/1998 | Topp | 313/509 |
| 6,069,444 | A | * 5/2000 | Krafcik et al. | 313/510 |
| 6,208,078 | B1 | * 3/2001 | Fujii et al. | 313/510 |
| 6,274,978 | B1 | * 8/2001 | Roach et al. | 313/483 |

FOREIGN PATENT DOCUMENTS

| TW | 295769 | 1/1997 |
|---|---|---|
| TW | 364275 | 1/1999 |

OTHER PUBLICATIONS

U.S. Ser. No. 09/469,702, filed Dec. 22, 1999 (RD–27,258).
U.S. Ser. No. 09/258,935, field Mar. 1, 1999 (RD–26,485).
Junji Kido et al., Organic Electroluminescent Devices Based on Molecularly Doped Polymers, 61 Appl. Phys. Lett. 761–763 (1992).
R. H. Friend, 4 Journal of Molecular Electronics 37–46 (1988).
Gerrit Klarner et al., Colorfast Blue Light Emitting Random Copolymers Derived from Di–n–hexyfluorene and Anthracene, 10 Adv. Mater. 993–997 (1998).
Chung–Chih Wu et al., Efficient Organic Electroluminescent Devices Using Single–Layer Doped Polymer Thin Films with Bipolar Carrier Transport Abilities, 44 IEEE Tras. On Elec. Devices 1269–1281 (1997).
A. W. Grice et al., High Brightness and Efficiency of Blue Light–Emitting Polymer Diodes, 73 Appl. Phys. Letters 629–631 (1998).
Junji Kido et al., Multilayer White Light–Emitting Organic Electroluminescent Device, 267 Science 1332–1334 (1995).
Hiroyuki Suzuki et al., Near–ultraviolet Electroluminescence from Polysilanes, 331 Thin Solid Films 64–70 (1998).

* cited by examiner

Primary Examiner—Robert H. Kim
Assistant Examiner—Jurie Yun
(74) Attorney, Agent, or Firm—Toan P. Vo; Noreen C. Johnson

(57) ABSTRACT

The invention relates to a light source comprising one or more organic light emitting devices mounted on a mounting substrate, each of the organic light emitting devices comprising a first electrode which is light transmissive, an organic light emitting layer, a second electrode, a first device electrical contact extending from the first electrode to the mounting substrate, and a second device electrical contact extending from the second electrode to the mounting substrate. The invention also relates to a method of making such a light source.

24 Claims, 8 Drawing Sheets

ORGANIC LIGHT EMITTING DEVICE AND METHOD FOR MOUNTING

This application claims the benefit of U.S Provisional Application No. 60/178,451, filed Jan. 27, 2000 and U.S. Provisional Application No. 60/194,068, filed Mar. 31, 2000.

BACKGROUND OF THE INVENTION

1. Field of the Invention

The present invention relates generally to lighting applications, and more particularly to an organic light emitting device and a light source comprising a plurality of organic light emitting devices mounted on a common substrate.

2. Description of the Related Art

There are many examples of lighting devices which comprise inorganic light emitting diodes (LEDs) or organic light emitting devices (OLEDs). One example is a commercially available blue-emitting inorganic gallium nitride LED which is coated with yellow-emitting phosphor particles to produce white light. The LED is essentially a point source of light rather than an extended area source of light.

An example of an OLED is set forth in U.S. Pat. No. 5,294,870, which describes an organic electroluminescent multicolor display device comprising an organic electroluminescent source emitting blue light with green- and red-emitting fluorescent materials applied to different subpixel areas. This device emits different colors from the different subpixel areas by color shifting with the green- and red-emitting fluorescent materials.

Another example of an OLED is described in Junji Kido et al., "Multilayer White Light-Emitting Organic Electroluminescent Device", 267 Science 1332–1334 (1995). This device includes three emitter layers with different carrier transport properties, each emitting blue, green, or red light, which layers are used to generate white light. This OLED outputs white light over an area which is greater than that of an inorganic LED. However, its emitting area is still relatively small.

In some lighting applications, it is desirable to have extended area light sources. Although it is theoretically possible to increase the size of known OLED devices by using larger equipment, the process of coating thin, high quality organic layers over large areas may present many technical challenges. Issues that would typically need to be addressed in scaling up production to larger sizes include, for example, uniformity of coating thickness, pinholes, particulates, CTE mismatches during thermal excursions, organic material stability to processing chemicals, and adhesion to organic and inorganic interfaces. Moreover, a defect anywhere in a large panel may necessitate scrapping the entire panel. Large equipment is also more costly.

It would be desirable, therefore, to have a light source with a large emitting area and an effective method of making such a light source.

BRIEF SUMMARY OF THE INVENTION

The invention relates to a light source comprising a mounting substrate, at least two organic light emitting devices mounted on the mounting substrate, each of the at least two organic light emitting devices comprising a first electrode which is light transmissive, an organic light emitting layer, a second electrode, a first device electrical contact extending from the first electrode to the mounting substrate, and a second device electrical contact extending from the second electrode to the mounting substrate.

The invention also relates to an organic light emitting device comprising a first electrode which is light transmissive, an organic light emitting layer positioned adjacent to the first electrode, the organic light emitting layer having an imaginary surface running therethrough defining a first side and a second side of the organic light emitting device, wherein the first electrode is on the first side of the organic light emitting device, a second electrode positioned adjacent to the organic light emitting layer on the second side of the organic light emitting device, a first device electrical contact extending from the first electrode to the second side of the organic light emitting device, and a second device electrical contact extending from the second electrode.

The invention also relates to a method of making a light source comprising the steps of providing a plurality of organic light emitting devices, each of the organic light emitting devices having first and second device electrical contacts which have respective first and second device contacting surfaces which occupy a common plane, the first and second device electrical contacts being electrically connected with first and second electrodes of the organic light emitting device, respectively, and mounting the plurality of organic light emitting devices on a mounting substrate such that the first and second device contacting surfaces make electrical contact with corresponding first and second mounting electrical contacts on the mounting substrate.

BRIEF DESCRIPTION OF THE DRAWINGS

Other features and advantages of the invention will be apparent from the following detailed description of preferred embodiments and the accompanying drawings, in which.

DETAILED DESCRIPTION OF THE INVENTION

Figure 1:
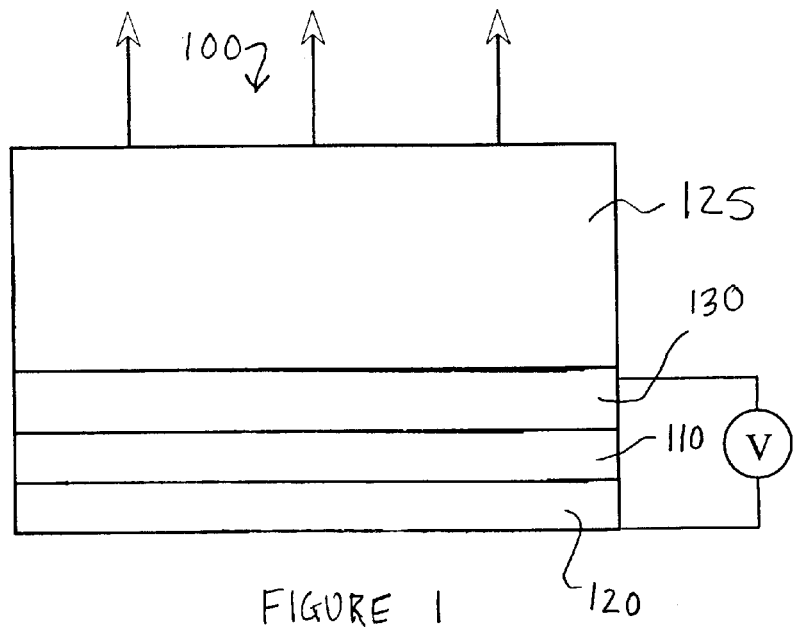
FIG. 1 is a drawing of an organic light emitting device according to one embodiment of the invention.

FIG. 1 is a drawing of an organic light emitting device according to an exemplary embodiment of the invention. The organic light emitting device 100 includes an organic light emitting layer 110 disposed between two electrodes, e.g., a cathode 120 and an anode 130. The organic light emitting layer 110 emits light upon application of a voltage across the anode and cathode. The organic light emitting device 100 typically includes a device substrate 125, such as glass or transparent plastics such as PET (MYLAR), polycarbonate, and the like, as shown in FIG. 1. The term "organic light emitting device" generally refers to the combination which includes the organic light emitting layer, the cathode, and the anode, and which may also include other elements such as the device substrate, device electrical contacts, and a photoluminescent layer, as will be described below.

The anode and cathode inject charge carriers, i.e. holes and electrons, into the organic light emitting layer 110 where they recombine to form excited molecules or excitons which emit light when the molecules or excitons decay. The color of light emitted by the molecules depends on the energy difference between the excited state and the ground state of the molecules or excitons. Typically, the applied voltage is about 3–10 volts but can be up to 30 volts or more, and the external quantum efficiency (photons out/electrons in) is between 0.01% and 5%, but could be up to 10%, 20%, 30%, or more. The organic light emitting layer 110 typically has a thickness of about 50–500 nanometers, and the electrodes 120, 130 each typically have a thickness of about 100–1000 nanometers.

The cathode 120 generally comprises a material having a low work function value such that a relatively small voltage causes emission of electrons from the cathode. The cathode 120 may comprise, for example, calcium or a metal such as gold, indium, manganese, tin, lead, aluminum, silver, magnesium, or a magnesium/silver alloy. Alternatively, the cathode can be made of two layers to enhance electron injection. Examples include a thin inner layer of LiF followed by a thicker outer layer of aluminum or silver, or a thin inner layer of calcium followed by a thicker outer layer of aluminum or silver.

The anode 130 typically comprises a material having a high work function value. The anode 130 is preferably transparent so that light generated in the organic light emitting layer 110 can propagate out of the organic light emitting device 100. The anode 130 may comprise, for example, indium tin oxide (ITO), tin oxide, nickel, or gold. The electrodes 120, 130 can be formed by conventional vapor deposition techniques, such as evaporation or sputtering, for example.

A variety of organic light emitting layers 110 can be used in conjunction with exemplary embodiments of the invention. According to one embodiment shown in FIG. 1, the organic light emitting layer 110 comprises a single layer. The organic light emitting layer 110 may comprise, for example, a conjugated polymer which is luminescent, a hole-transporting polymer doped with electron transport molecules and a luminescent material, or an inert polymer doped with hole transporting molecules and a luminescent material. The organic light emitting layer 110 may also comprise an amorphous film of luminescent small organic molecules which can be doped with other luminescent molecules.

According to other embodiments of the invention shown in FIGS. 2–5, the organic light emitting layer 110 comprises two or more sublayers which carry out the functions of hole injection, hole transport, electron injection, electron transport, and luminescence. Only the luminescent layer is required for a functioning device. However, the additional sublayers generally increase the efficiency with which holes and electrons recombine to produce light. Thus the organic light emitting layer 110 can comprise 1–4 sublayers including, for example, a hole injection sublayer, a hole transport sublayer, a luminescent sublayer, and an electron injection sublayer. Also, one or more sublayers may comprise a material which achieves two or more functions such as hole injection, hole transport, electron injection, electron transport, and luminescence.

Embodiments in which the organic light emitting layer 110 comprises a single layer, as shown in FIG. 1, will now be described.

According to one embodiment, the organic light emitting layer 110 comprises a conjugated polymer. The term conjugated polymer refers to a polymer which includes a delocalized $\pi$-electron system along the backbone of the polymer. The delocalized $\pi$-electron system provides semi-conducting properties to the polymer and gives it the ability to support positive and negative charge carriers with high mobilities along the polymer chain. The polymer film has a sufficiently low concentration of extrinsic charge carriers that on applying an electric field between the electrodes, charge carriers are injected into the polymer and radiation is emitted from the polymer. Conjugated polymers are discussed, for example, in R. H. Friend, 4 Journal of Molecular Electronics 37–46 (1988).

One example of a conjugated polymer which emits light upon application of a voltage is PPV (poly(p-phenylenevinylene)). PPV emits light in the spectral range of about 500–690 nanometers and has good resistance to thermal and stress induced cracking. A suitable PPV film typically has a thickness of about 100–1000 nanometers. The PPV film can be formed by spin coating a solution of the precursor to PPV in methanol onto a substrate and heating in a vacuum oven.

Various modifications can be made to the PPV while retaining its luminescent properties. For example, the phenylene ring of the PPV can optionally carry one or more substituents each independently selected from alkyl, alkoxy, halogen, or nitro. Other conjugated polymers derived from PPV may also be used in conjunction with exemplary embodiments of the invention. Examples of such derivatives of PPV include: 1) polymers derived by replacing the phenylene ring with a fused ring system, e.g. replacing the phenylene ring with an anthracene or napthalene ring system. These alternative ring systems may also carry one or more substituents of the type described above with respect to the phenylene ring; 2) polymers derived by replacing the phenylene ring with a heterocyclic ring system such as a furan ring. The furan ring may carry one or more substituents of the type described above in connection with the phenylene ring; 3) polymers derived by increasing the number of vinylene moieties associated with each phenylene or other ring system. The above described derivatives have different energy gaps, which allows flexibility in producing an organic light emitting layer 110 which emits in a desired color range or ranges. Additional information on luminescent conjugated polymers is described in U.S. Pat. No. 5,247,190, which is hereby incorporated by reference.

Other examples of suitable conjugated polymers include polyfluorenes such as 2,7-substituted-9-substituted fluorenes and 9-substituted fluorene oligomers and polymers. Polyfluorenes generally have good thermal and chemical stability and high solid-state fluorescence quantum yields. The fluorenes, oligomers and polymers may be substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy. moiety. The fluorene polymers and oligomers may be substituted at the 2- and 7'-positions. The monomer units of the fluorene oligomers and polymers are bound to one another at the 2- and 7'-positions. The 2,7'-aryl-9-substituted fluorene oligomers and polymers may be further reacted with one another to form higher molecular weight polymers by causing the optional moieties on the terminal 2,7'-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on such polyfluorenes is described in U.S. Pat. No. 5,708,130, which is hereby incorporated by reference.

Other suitable polyfluorenes which can be used in conjunction with exemplary embodiments of the invention include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT can be prepared by the nickel-mediated copolymerization of the corresponding aryl dibromides. The final polymer molecular weight can be controlled by adding the end capping reagent 2-bromofluorene at different stages of the polymerization. The copolymers are thermally stable with decomposition temperatures above 400° C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene", 10 Adv. Mater. 993–997 (1998), which is hereby incorporated by reference.

According to a second embodiment of a single layer device as shown in FIG. 1, the organic light emitting layer 110 comprises a molecularly doped polymer. A molecularly doped polymer typically comprises a binary solid solution of charge transporting molecules which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methyl methacrylate) (PMMA) molecularly doped with the hole transporting molecule N,N'-diphenyl-N,N'-bis (3-methylsphenyl)-1,1'-biphenyl-4,4'-diamine (TPD) and the luminescent material tris(8-quinolinolato)-aluminum (III) (Alq). TDP has a high hole drift mobility of $10^{-3}$ $cm^2$/volt-sec, while Alq is a luminescent metal complex having electron transporting properties in addition to its luminescent properties.

The doping concentration is typically about 50%, while the molar ratio of TDP to Alq may vary from about 0.4 to 1.0, for example. A film of the doped PMMA can be prepared by mixing a dichloroethane solution containing suitable amounts of TPD, Alq, and PMMA, and dip coating the solution onto the desired substrate, e.g. an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers", 61 Appl. Phys. Lett. 761–763 (1992), which is hereby incorporated by reference.

Figure 2:
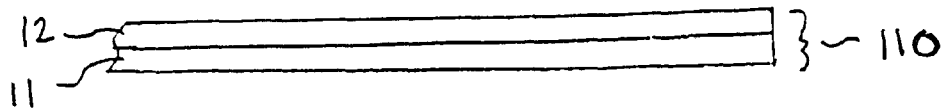
FIGS. 2–5 illustrate various examples of organic light emitting layers formed of two or more sublayers.

According to another embodiment of the invention shown in FIG. 2, the organic light emitting layer 110 comprises two sublayers. The first sublayer 11 provides hole transport, electron transport, and luminescent properties and is positioned adjacent the cathode 120. The second sublayer 12 serves as a hole injection sublayer and is positioned adjacent the anode 130. The first sublayer 11 comprises a hole-transporting polymer doped with electron transporting molecules and a luminescent material, e.g. a dye or polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprise the organic dyes coumarin 460 (blue), coumarin 6 (green) or nile red. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2–1.0 weight percent organic dye.

The second sublayer 12 serves as a hole injection sublayer and may comprise poly(3,4)ethylenedioxythiophene/ polystyrenesulphonate (PEDT/PSS), for example, available from Bayer Corporation, which can be applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities", 44 IEEE Trans. on Elec. Devices 1269–1281 (1997), which is hereby incorporated by reference.

Figure 3:
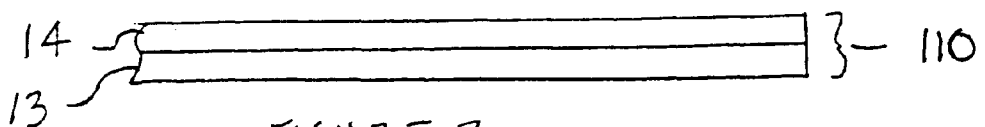

According to another embodiment of the invention shown in FIG. 3, the organic light emitting layer 110 includes a first sublayer 13 comprising a luminescent sublayer and a second sublayer 14 comprising a hole transporting sublayer. The hole transporting sublayer 14 may comprise an aromatic amine that is readily and reversibly oxidizable, for example. One example of such a luminescent sublayer and a hole transporting sublayer is described in A. W. Grice et al, "High Brightness and Efficiency of Blue Light-Emitting Polymer Diodes", 73 Appl. Phys. Letters 629–631 (1998), which is hereby incorporated by reference. The device described therein comprises two polymer layers sandwiched between an ITO electrode and a calcium electrode. The polymer layer next to the ITO is a hole transport layer and comprises a polymeric triphenyldiamine derivative (poly-TPD). The blue emitting polymer layer which is next to the calcium electrode is poly(9,9-dioctylfluorene).

Figure 4:
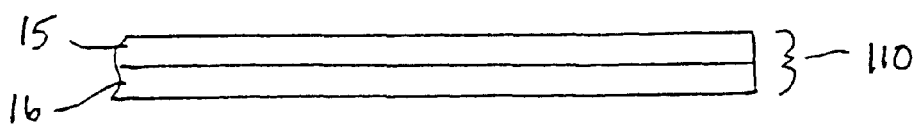

According to another embodiment of the invention shown in FIG. 4, the organic light emitting layer 110 comprises a first sublayer 15 which includes luminescent and hole transport properties, and a second sublayer 16 which includes electron injection properties. The first sublayer 15 comprises a polysilane, and the second sublayer comprises an oxadiazole compound. This structure produces ultraviolet (UV) light.

Polysilanes are linear silicon (Si)-backbone polymers substituted with a variety of alkyl and/or aryl side groups. In contrast to π-conjugated polymers, polysilanes are quasi one-dimensional materials with delocalized σ-conjugated electrons along the polymer backbone chain. Due to their one-dimensional direct-gap nature, polysilanes exhibit a sharp photoluminescence with a high quantum efficiency in the ultraviolet region. Examples of suitable polysilanes include poly(di-n-butylsilane) (PDBS), poly(di-n-pentylsilane) (PDPS), poly(di-n-hexylsilane) (PDHS), poly (methyl-phenylsilane) (PMPS), and poly[-bis(p-butylphenyl)silane] (PBPS). The polysilane sublayer 15 can be applied by spin coating from a toluene solution, for example. The electron injection sublayer 16 may comprise 2,5-bis(4-biphenyl)-1,3,4-oxadiazole (BBD), for example. Additional information on UV-emitting polysilane organic light emitting layers is described in Hiroyuki Suzuki et al, "Near-ultraviolet Electroluminescence from Polysilanes", 331 Thin Solid Films 64–70 (1998), which is hereby incorporated by reference.

Figure 5:
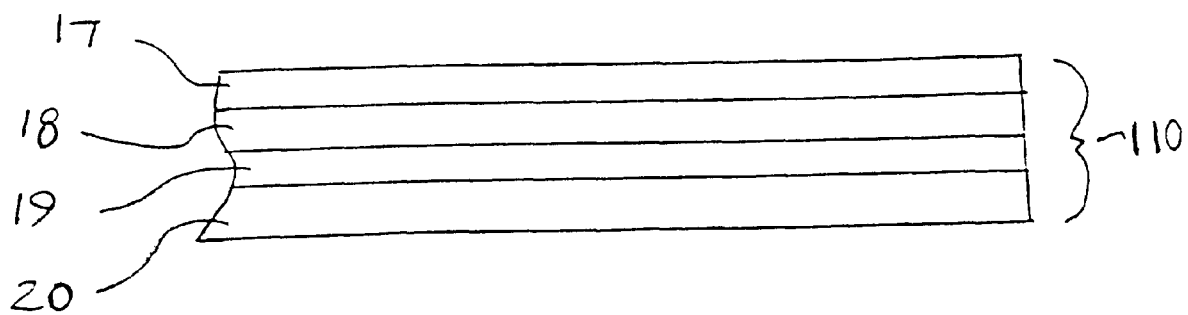

According to another embodiment of the invention shown in FIG. 5, the organic light emitting layer 110 comprises a hole injecting sublayer 17, a hole transporting sublayer 18, a luminescent sublayer 19, and an electron injecting sublayer 20. The hole injecting sublayer 17 and hole transporting sublayer 18 efficiently provide holes to the recombination area. The electrode injecting sublayer 20 efficiently provides electrons to the recombination area.

The hole injecting sublayer 17 may comprise a porphyrinic compound, such as a metal free phthalocyanine or a metal containing phthalocyanine, for example. The hole transporting sublayer 18 may comprise a hole transporting aromatic tertiary amine, where the latter is a compound containing at least one trivalent nitrogen atom that is bonded only to carbon atoms, at least one of which is a member of an aromatic ring. The luminescent sublayer 19 may comprise, for example, a mixed ligand aluminum chelate emitting in the blue wavelengths, such as bis(R-8-quinolinolato)-(phenolato)aluminum(III) chelate where R is a ring substituent of the 8-quinolinolato ring nucleus chosen to block the attachment of more than two 8-quinolinolato ligands to the aluminum atom. The electron injection sublayer 20 may comprise a metal oxinoid charge accepting compound such as a tris-chelate of aluminum. Additional information on such four-layer materials and devices are described in U.S. Pat. No. 5,294,870, which is hereby incorporated by reference.

The above examples of organic light emitting layers 110 can be used to design an organic light emitting device which emits in one or more desired colors. For example, the organic light emitting device 100 can emit ultraviolet, blue, green, or red light.

The following example describes a blue-emitting organic light emitting device 100 which can be used in conjunction with exemplary embodiments of the invention.

EXAMPLE

A blue-emitting organic light emitting device was constructed as follows. Indium tin oxide (ITO) coated glass (15 ohm-square) was obtained from Applied Films Corporation and portions of it were etched away using the vapors of aqua regia. This substrate was then mechanically cleaned with a detergent, soaked in a methanol solution followed by a boiling isopropyl alcohol solution, and finally placed in an ozone cleaner for 5 minutes. An approximately 5 nanometer (nm) layer of poly(3,4)ethylenedioxythiophene/polystyrenesulphonate (PEDT/PSS) from Bayer Corporation was then spin coated onto the ITO. Approximately 100 nm of a polymer blend consisting of poly(9-vinyl carbazole) (PVK) from Aldrich Co., 2-(4-biphenylyl)-5-(4-tert-butyl-phenyl)-1,3,4-oxadiazole (PBD) from Aldrich Co., and 7-Diethylamino-4-methylcoumarin (Coumarin 460) from Exciton Co. with weight percent ratios of 100:40:1 was then spin coated onto the PEDT layer using dichloroethane as the solvent. Next, a cathode consisting of an approximately 0.8 nm layer of lithium fluoride followed by about 100 nm of aluminum was evaporated onto the device through a shadow-mask to define a cathode pattern. The device was then transferred to a glove box and a glass slide was attached to the cathode side of the device with epoxy in order to provide encapsulation. The resulting device emitted blue light upon application of a voltage.

Figure 6:
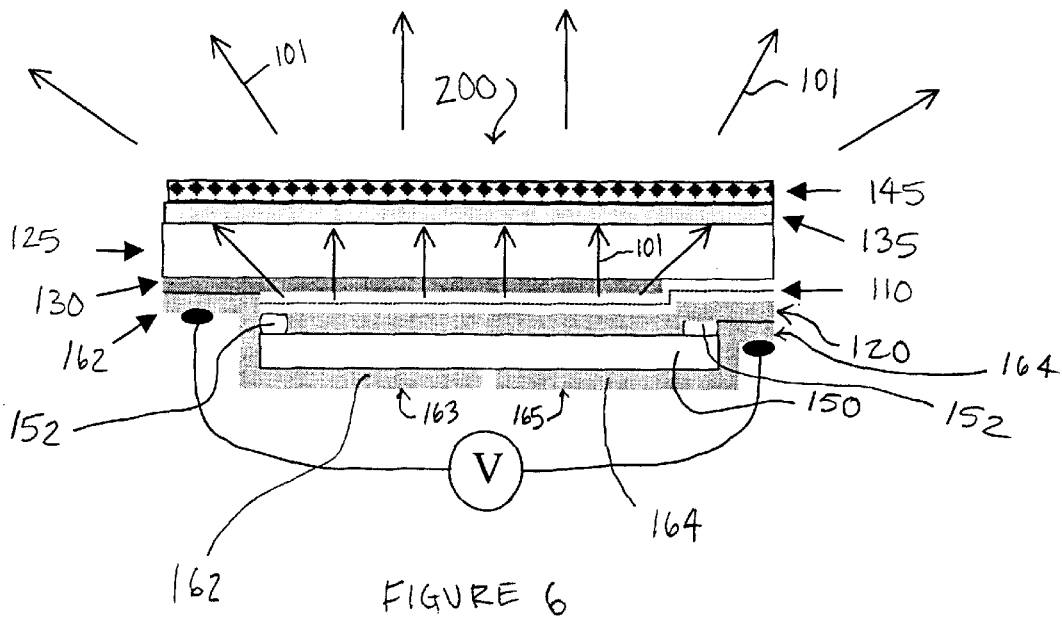
FIG. 6 is a side view of an organic light emitting device according to an exemplary embodiment of the invention.
Figure 7:
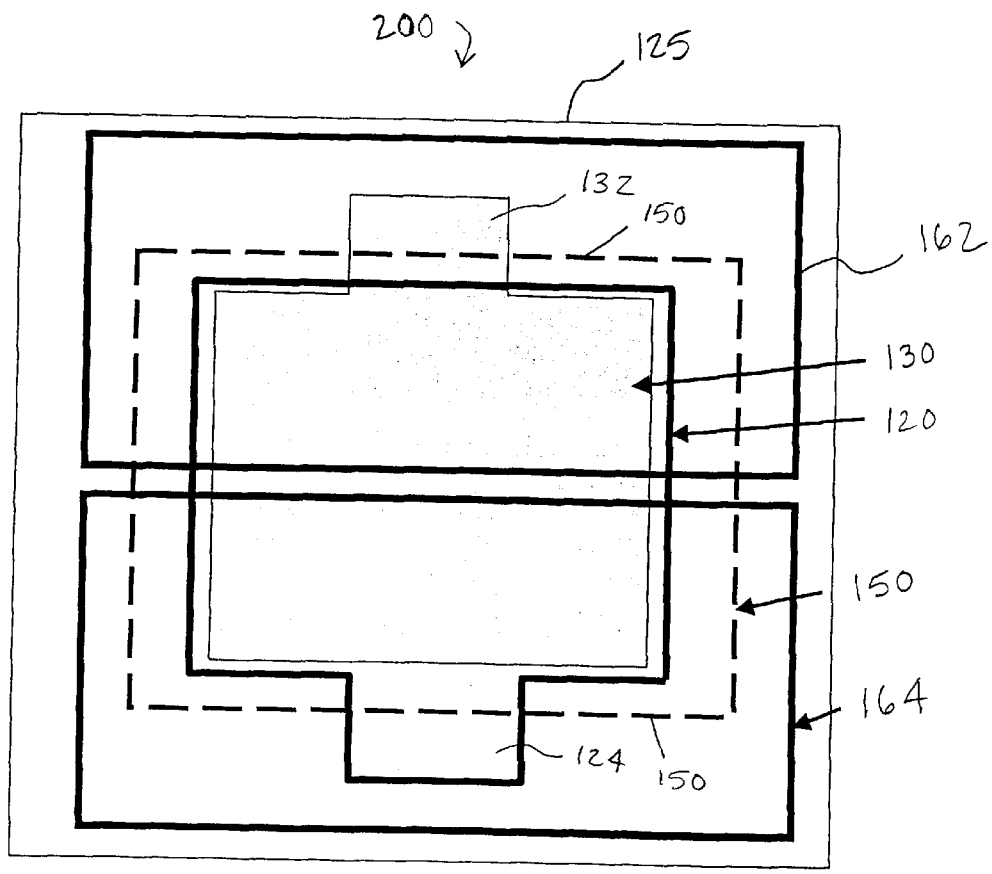
FIG. 7 is a bottom view of the organic light emitting device of FIG. 6.

Referring to FIGS. 6 and 7, an organic light emitting device is shown according to another embodiment of the invention. The organic light emitting device 200 comprises an organic light emitting layer 110, a cathode 120, and an anode 130 which is light transmissive. The organic light emitting device 200 also includes a device substrate 125 which is light transmissive. The elements in FIGS. 6 and 7 (e.g. the anode 130, cathode 120, light emitting layer 110) corresponding to those in FIG. 1 can be formed of the same materials as described above with respect to FIG. 1. Upon application of a voltage, light (represented by arrows 101) is generated in the light emitting layer 110 and propagates through the anode 130 and the device substrate 125.

As shown in FIG. 6, the organic light emitting device 200 may optionally include a photoluminescent layer 135. The photoluminescent layer 135 comprises a photoluminescent material which absorbs light from the organic light emitting layer 110 and emits light typically having a longer wavelength. The photoluminescent material typically comprises an inorganic phosphor, but may also comprise an organic photoluminescent material such as an organic dye. Examples of phosphor materials that can be utilized include those phosphors based on cerium doped into a $Y_3Al_5O_{12}$ (YAG) lattice which crystallizes in the garnet structure. Specific examples include $(Y_{1-x-y}Gd_xCe_y)_3Al_5O_{12}$ (YAG:Gd,Ce), $(Y_{1-x}Ce_x)_3Al_5O_{12}$ (YAG:Ce), $(Y_{1-x}Ce_x)_3(Al_{1-y}Ga_y)_5O_{12}$ (YAG:Ga,Ce) and $(Y_{1-x-y}Gd_xCe_y)_3(Al_{5-z}Ga_z)_5O_{12}$ (YAG:Gd,Ga,Ce) and $(Gd_{1-x}Ce_x)Sc_2Al_3O_{12}$ (GSAG). The YAG phosphors can be described generally as $(Y_{1-X-Y}Gd_XCe_Y)_3(Al_{1-Z}Ga_Z)_5O_{12}$, wherein $x+y \leq 1$; $0 \leq x \leq 1$; $0 \leq y \leq 1$; and $0 \leq z \leq 1$. The position of the peak of the emission band varies considerably in the aforementioned phosphors. Depending on the garnet composition, the $Ce^{3+}$ emission can be tuned from the green (~540 nm; YAG:Ga, Ce) to the red (~600 nm; YAG:Gd:Ce) without appreciable loss in the luminescence efficiency. An appropriate phosphor material or blend of phosphor materials in combination with a blue or UV emission of the organic light emitting device 100 can produce a white field corresponding to a wide range of color temperatures. Light sources in the form of large area white light electroluminescent panels which closely approximate the color, CRI, and brightness of conventional fluorescent lamps can be made with such phosphors and organic light emitting devices.

In addition, more than one phosphor material may be combined together and then utilized with an organic light emitting device to achieve different colors, color temperatures, and color rendition indices. Other phosphors which can be used are described in U.S. Ser. No. 09/469,702, entitled "Luminescent Display and Method of Making", filed Dec. 22, 1999, in the name of Anil Duggal and Alok Srivastava, which is hereby incorporated by reference. An example of a suitable red emitting inorganic phosphor is $SrB_4O_7:Sm^{2+}$, where the $Sm^{2+}$ following the colon represents an activator. This phosphor absorbs most visible wavelengths shorter than 600 nm and emits light as a deep red line with a wavelength greater than 650 nm. An example of a suitable green emitting inorganic phosphor is $SrGa_2S_4:Eu^{2+}$. This phosphor absorbs below 500 nm and has a maximum emission at 535 nanometers. An example of a suitable blue emitting inorganic phosphor is $BaMg_2Al_{16}O_{27}:Eu^{2+}$. $BaMg_2Al_{16}O_{27}:Eu^{2+}$ absorbs most wavelengths below 430 nm and has a maximum emission at 450 nm. Examples of organic dyes which can be utilized in the photoluminescent layer include coumarin 460 (blue), coumarin 6 (green), and nile red.

Referring again to FIG. 6, the organic light emitting device 200 may also include a scattering layer 145 comprising scattering particles such as $TiO_2$ or $SiO_2$ for effective color mixing and brightness uniformity. The scattering particles can also be mixed into the photoluminescent layer, rather than as a separate layer, if desired.

Adjacent to the cathode 120 is a sealing member 150, typically comprising glass, which provides a barrier to oxygen and water. The sealing member 150, in conjunction with a sealant 152 which may comprise epoxy, a metal, or a glass frit, for example, provides a near hermetic barrier to prevent water and oxygen penetration into the cathode 120, anode 130 and organic light emitting layer 110.

Formed adjacent to the sealing member 150 are first and second device electrical contacts 162, 164, which provide electrical connections to the anode 130 and cathode 120, respectively. As shown most clearly in FIG. 7, the first device electrical contact 162 connects electrically to the anode 130 in a tab region 132 of the anode 130. The tab region 132 is beyond the perimeter of the sealing member 150. The second device electrical contact 164 connects electrically to the cathode 120 in a tab region 124 of the cathode 120. The tab region 124 is beyond the perimeter of the sealing member 150. The organic light emitting layer 110 (not shown in FIG. 7) typically occupies at least the overlap region of the anode 130 and cathode 120 and may extend beyond these electrodes.

Referring again to FIG. 6, the device electrical contacts 162, 164 typically have respective device contacting surfaces 163, 165 which occupy a common plane. These device contacting surfaces 163, 165 facilitate the mounting of one or more organic light emitting devices 200 onto a mounting substrate, as will be described further below in connection with FIG. 9.

An advantageous feature of the device electrical contacts 162, 164 can be described with reference to an imaginary surface running through the light emitting layer 110. The imaginary surface, which is typically planar, divides the organic light emitting device 200 into a first side and a second side. The anode 130 is on the first side, and the cathode 120 is on the second side. The light is emitted through the first side, and the device electrical contacts 162, 164 extend to the second side. For example, the first device electrical contact 162 extends from the anode 130 on the first side to the second side of the organic light emitting device. The second device electrical contact 164 extends from the cathode 120 on the second side to another location on the second side of the organic light emitting device. Thus, the organic light emitting device 200 can be powered by contacting both device electrical contacts 162, 164 on a common planar surface 163, 165 which is on an opposite side of the organic light emitting device as where the light emission occurs. Typically the planar surface defined by surfaces 163, 165 is parallel to the light emitting layer 110 and the device substrate 125. This configuration allows a number of organic light emitting devices 200 to be easily mounted adjacent to each other ("tiled") on a mounting substrate.

As shown in FIG. 7, the device substrate 125 can define the area of the organic light emitting device 200. The first and second device electrical contacts 162, 164 can occupy an area which is within the area of the device substrate 125. Therefore, two organic light emitting devices 200 can be placed directly adjacent to each other without any electrical connectors in between and with a small separation distance between the adjacent light emitting device substrates 125. For example, if desired, the separation distance could be less than 2 centimeters (cm), 1 cm, 0.5 cm or 0.25 cm, but is typically greater than 0.1 cm.

Figure 8:
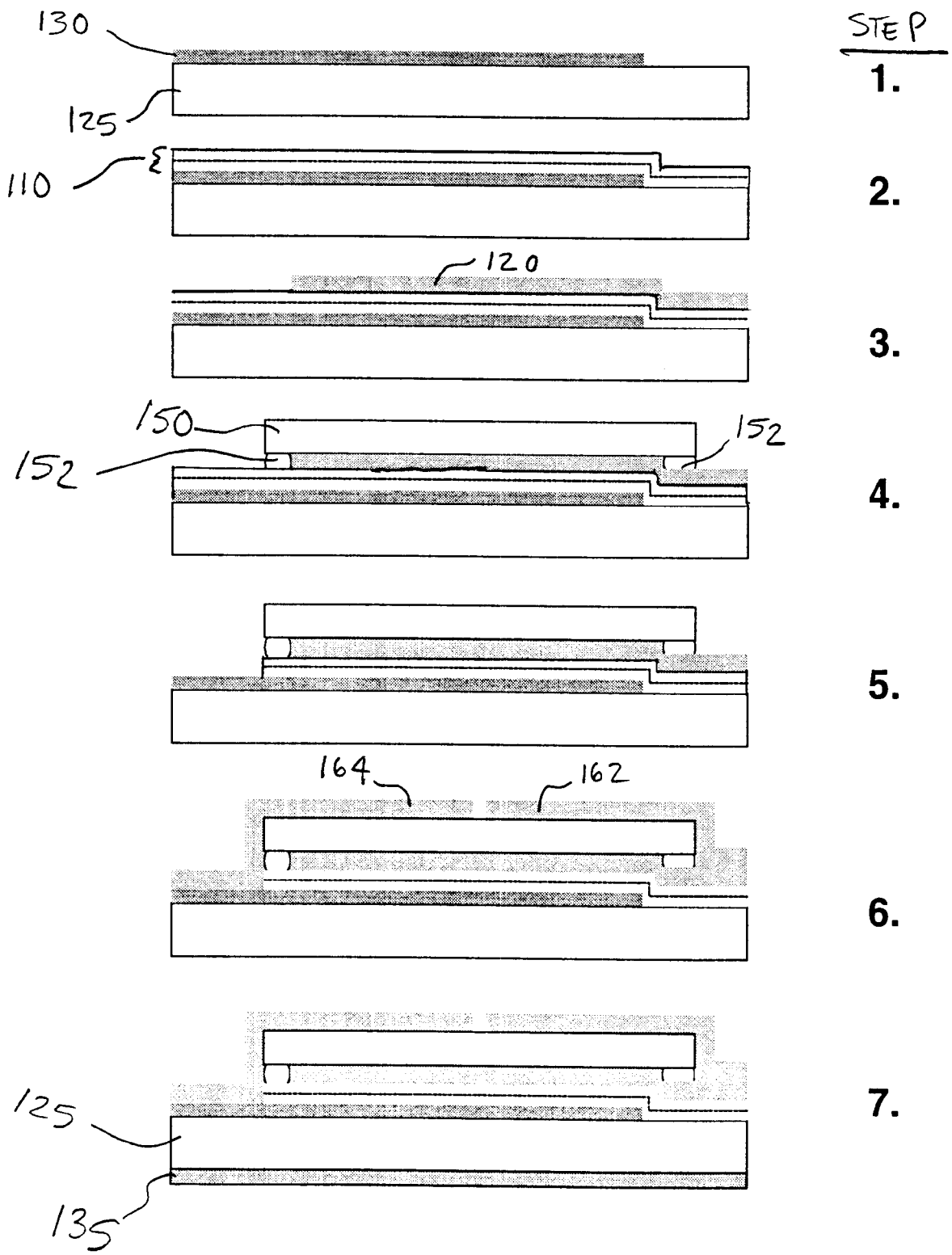
FIG. 8 illustrates a method of making the organic light emitting device of FIG. 6.

FIG. 8 illustrates a method for forming the organic light emitting device 200 of FIGS. 6 and 7 according to an exemplary embodiment of the invention. As shown in FIG. 8, step 1, a glass substrate 125 is sputter coated with a layer of thin indium tin oxide (ITO). The ITO is then patterned to form the anode 130, e.g in the pattern shown in FIG. 7. In step 2, the organic light emitting layer 110 (which may include one or more sublayers as shown in FIGS. 1–5) is deposited, for example by spin coating or inkjet processing. In step 3, the cathode 120 is deposited as a reflective structure comprising a thin layer of lithium fluoride overcoated with aluminum, for example. The cathode 120 can be deposited through a stencil mask by evaporation, for example. The sealing member 150, which may comprise glass, for example, is next applied with a sealant 152 in step 4 to form a near hermetic barrier.

In step 5, the organic light emitting layer 110 extending beyond the sealing member 150 is removed by solvent or dry etching methods. The device electrical contacts 162, 164, which may comprise a metal such as aluminum or silver, are then applied to the reflective side of the organic light emitting device 200 in step 6. The device electrical contacts 162, 164 allow for external contact to the organic light emitting device and additionally can provide a near hermetic seal to the anode 130, cathode 120, and light emitting layer 110. In step 7, optionally, a layer 135 of photoluminescent material, e.g. an inorganic phosphor, is applied to the device substrate 125. Optionally, a layer 145 of scattering particles can be applied in a subsequent step. The steps shown in FIG. 8 are of course merely an example of a method of making a light source, and not intended to be limiting.

Figure 9:
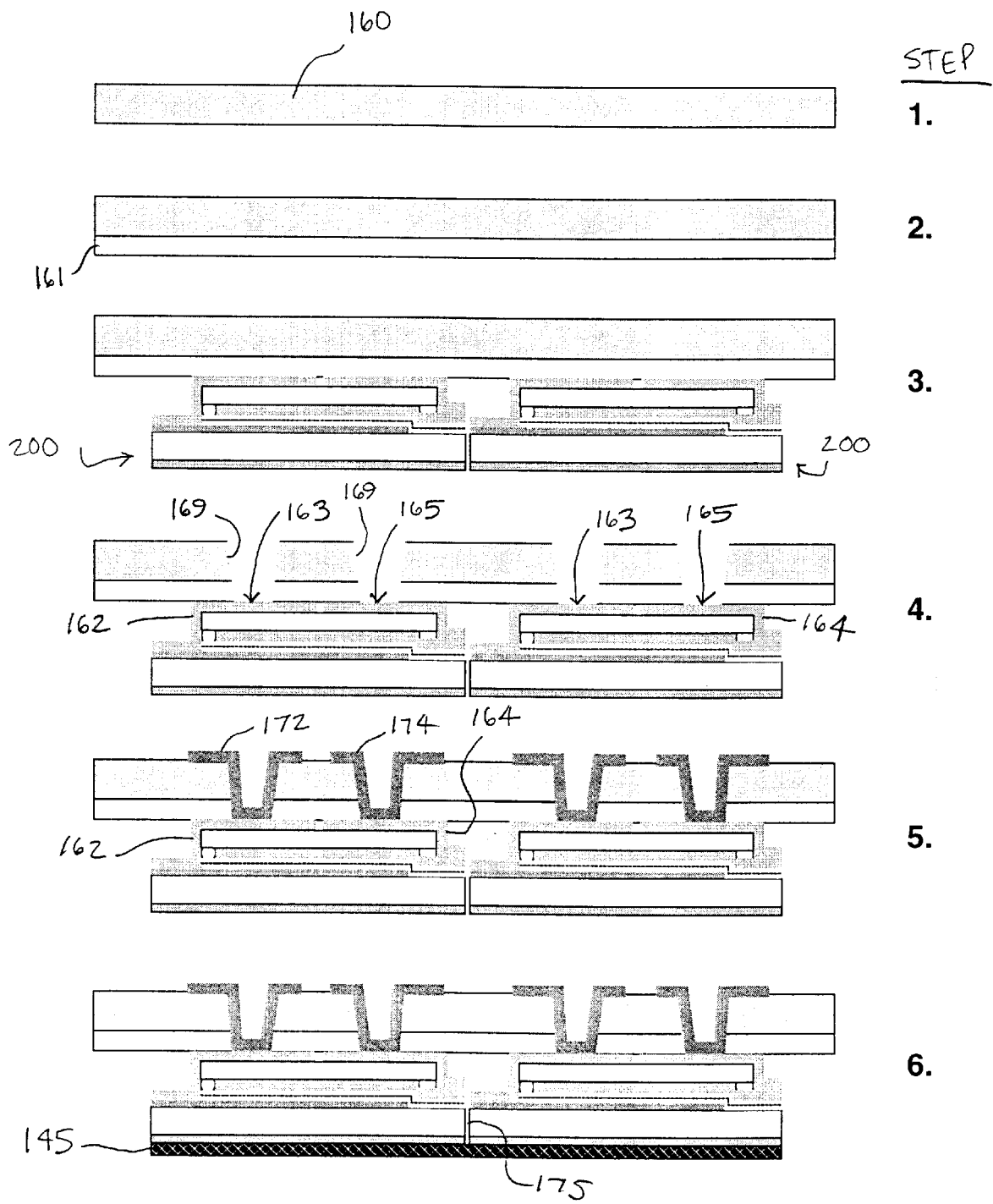
FIG. 9 illustrates a method of mounting a plurality of light emitting devices on a mounting substrate to produce a light source according to an exemplary embodiment of the invention.

FIG. 9 illustrates a method of mounting one or more organic light emitting devices onto a mounting substrate to form a light source according to an exemplary embodiment of the invention. The term "light source" generally refers to the combination of at least one, and usually many, organic light emitting devices 200 mounted on a mounting substrate. Step 1 shows the mounting substrate 160, which may comprise a conventional printed circuit board such as FR4 or GETEK, or a flexible polymer film such as Kapton E™ or Kapton H™ polyimide (Kapton is a trademark of E. I. Du Pont de Nemours & Co.), Apical AV polyimide (Apical is a trademark of Kanegafugi Chemical Company), or Upilex polyimide (Upilex is a trademark of UBE Industries, Ltd) for example. In one embodiment, free-standing Kapton™ polyimide is mounted on a rigid frame (not shown in FIG. 9) which rigidly supports the flexible film during processing and for end use if desired. An adhesive, typically comprising a material capable of adhering at a low temperature, can be applied to the rigid frame. Examples of suitable adhesives include materials such as ULTEM polyetherimide (ULTEM™ is a trademark of General Electric Company) and MULTIPOSIT™ XP-9500 thermoset epoxy (MULTIPOSIT is a trademark of Shipley Company Inc., Marlborough, Mass.).

In step 2, according to one embodiment, another adhesive 161, which is typically organic, such as ULTEM™, SPIE (siloxane polyimide epoxy) or other polyimide and epoxy blends, or cyanoacrylate is applied to the mounting substrate 160, as shown in FIG. 9. In step 3, one or more organic light emitting devices 200 are placed on the adhesive 161, and the adhesive is cured to bond the organic light emitting devices 200 to the mounting substrate 160.

In step 4, vias 169 are formed using laser ablation or reactive ion etching, for example, through the mounting substrate 160 and the adhesive 161 to the device contacting surfaces 163, 165 of the device electrical contacts 162, 164, respectively. In step 5, first and second mounting electrical contacts 172, 174 are formed or inserted into the via holes 169 to make contact with the device electrical contacts 162, 164, respectively. The mounting electrical contacts 172, 174 can be formed as a patterned metal layer using sputter or electroless plating techniques, in combination with electroplating if desired, and patterned with a standard photoresist and etch process. The interconnect metallization in one embodiment comprises a thin adhesion layer of 1000 angstroms (Å) sputtered titanium, coated by a thin layer of 3000 Å sputtered copper, coated by a layer of electroplated copper to a thickness of 4 microns, for example. An optional buffer layer of 1000 Å of titanium can be applied over the electroplated copper. The mounting electrical contacts 172, 174 can also be applied by the conventional methods of evaporation with a shadow mask or screen printing.

In step 6, optionally, a scattering layer 145 can be applied to organic light emitting devices 200 individually, or more typically can be applied across a number of organic light emitting devices 200, as shown in FIG. 9. The scattering layer 145 applied across multiple organic light emitting devices 200 helps to reduce any variations in output light intensity at the gaps 175 between adjacent organic light emitting devices 200. Although not shown in step 6, a nonconductive material such as SPIE (siloxane polyimide epoxy) can be inserted into the gaps 175 between adjacent organic light emitting devices 200. Although only two organic light emitting devices 200 are shown in FIG. 9, this method can of course be used to make large area light sources comprising many individual organic light emitting devices 200.

Although embodiments of the present invention allow the organic light emitting devices 200 to be placed very close to each other on the mounting substrate 160, it may be desirable in some applications to have a larger spacing between individual organic light emitting devices 200. In such cases, it may not be desirable to have a scattering layer 145 which bridges adjacent organic light emitting devices 200.

Spacing between organic light emitting devices 200 may also occur in the case where the mounting substrate 160 is designed to be flexible, curved, or non-planar. The mounting substrate 160 may be formed in any desired shape, e.g. to conform to an existing building structure. The organic light emitting devices 200 can be sized such that they collectively follow the shape of the mounting substrate. Thus, the combination of a flexible, curved, or non-planar mounting substrate and appropriately sized organic light emitting devices 200 can produce a light source having an emitting surface in many desired shapes, e.g. cylindrical, spherical, etc. The spacing of the organic light emitting devices 200 on the mounting substrate 160 can also be designed such that the mounting substrate 160 can form a right angle between adjacent organic light emitting devices 200. In this case, the emitting surfaces of adjacent organic light emitting devices would together form a corner with perpendicular emitting surfaces.

Figure 11:
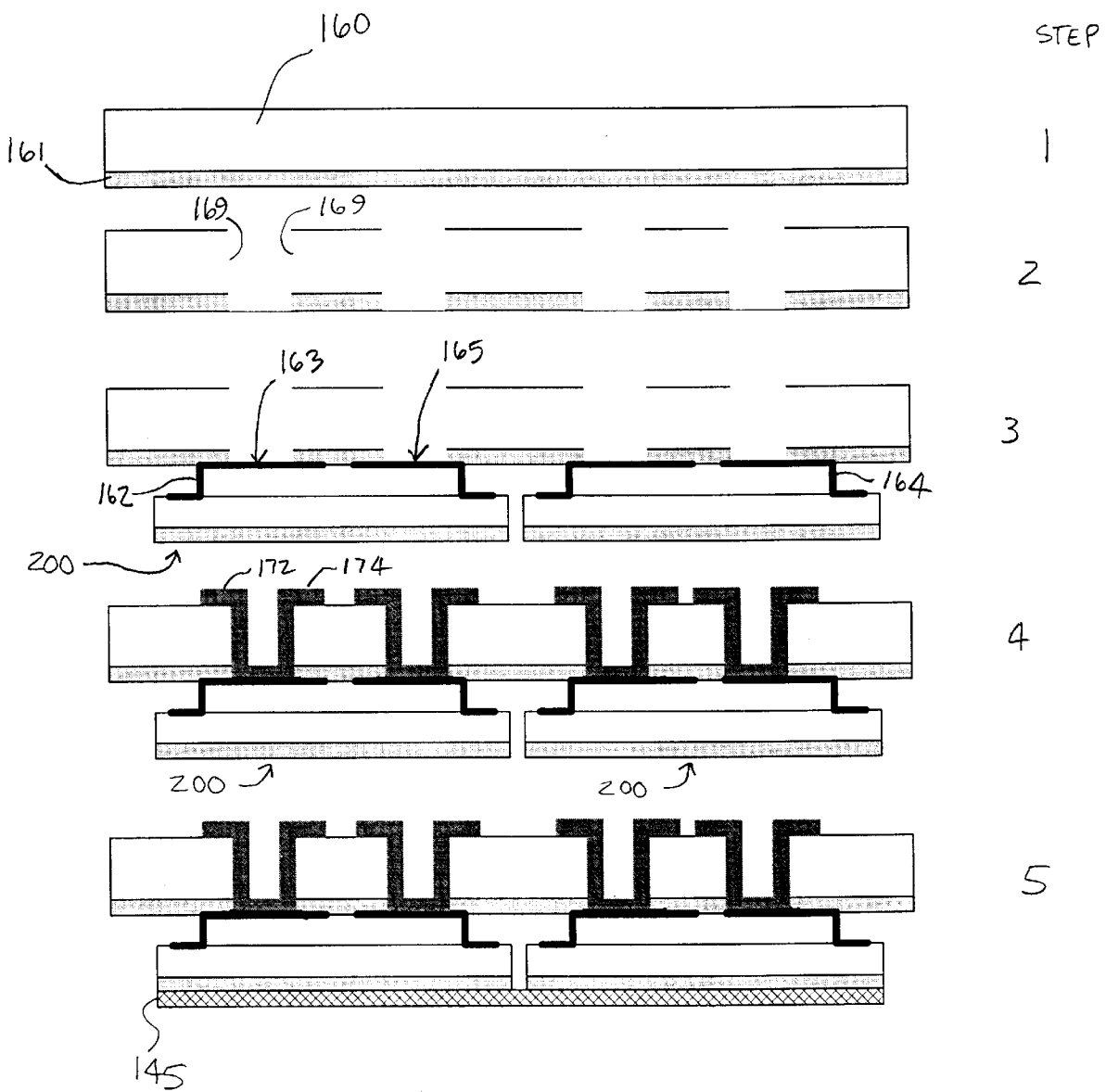
FIGS. 11–13 illustrate methods of mounting a plurality of light emitting devices on a mounting substrate to produce a light source according to other embodiments of the invention.

According to another embodiment of the invention shown in FIG. 11, an alternative sequence of attachment can be used, in which vias 169 can be formed before attachment of the individual organic light emitting devices 200. As shown in step 2, the vias 169 are formed through the mounting substrate 160 and the adhesive layer 161 using laser ablation, mechanical punching, mechanical drilling, or reactive ion etching, for example. In step 3, the organic light emitting devices 200 are mounted on the mounting substrate 160. The mounting electrical contacts 172, 174 can then be formed in step 4 as a patterned metal layer using sputter or electroless plating techniques, which may be in combination with electroplating, evaporation with a shadow mask, or screen printing, as described above. Optionally, a scattering layer 145 can be applied in step 5. This embodiment provides the advantage that the vias 169 can be drilled more easily without concern for the organic light emitting devices 200, which have not yet been installed on the mounting substrate 160 at the time of drilling.

Figure 12:
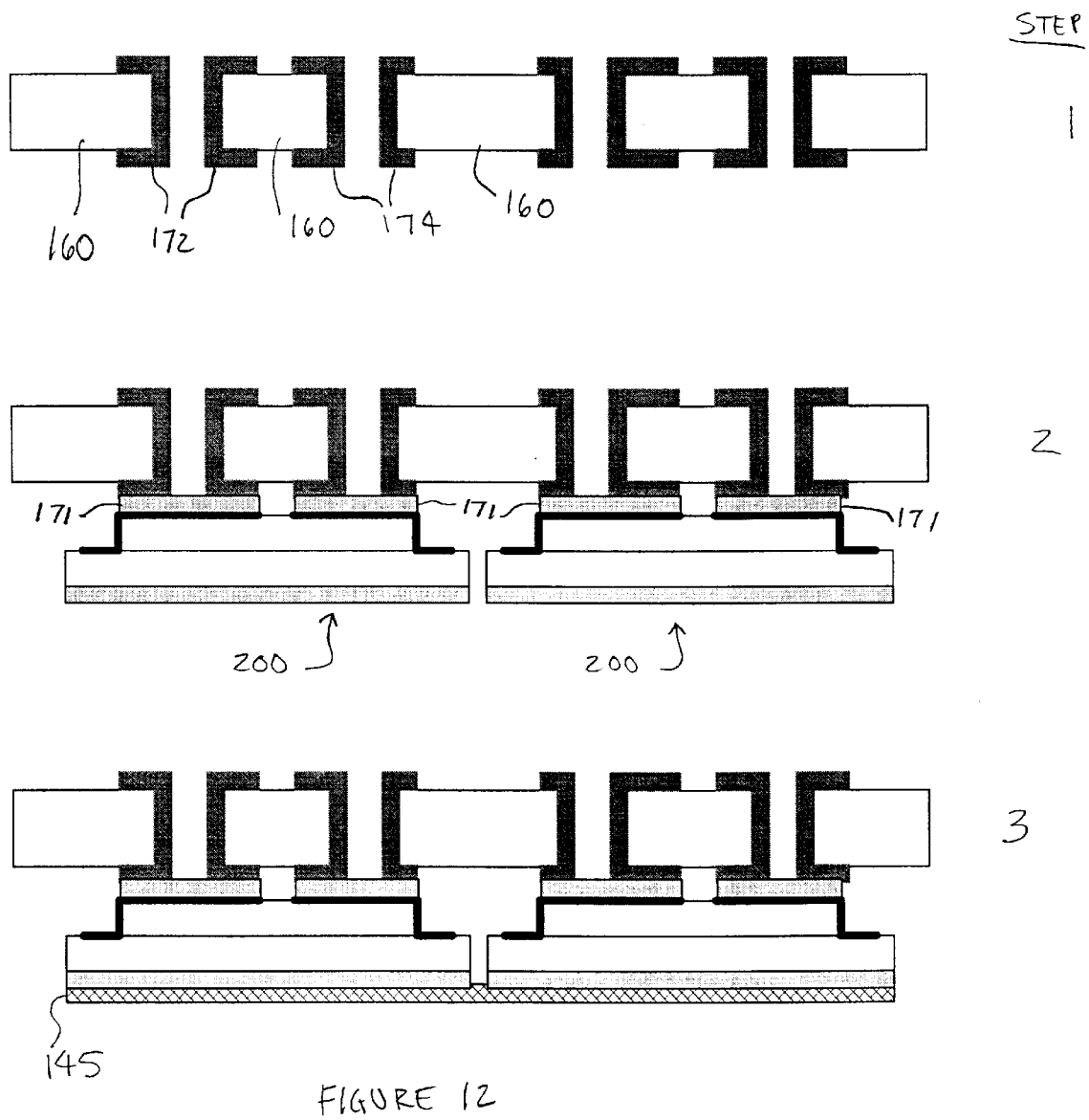

According to a further embodiment of the invention shown in FIG. 12, the organic light emitting devices 200 are mounted on the mounting substrate 160 by a conventional "flip chip" interconnect technique using an adhesive. As shown in FIG. 12, step 1, the mounting substrate 160 may comprise a pre-patterned double sided flex (e.g. a Kapton polyimide) or other suitable substrate material as described above with respect to FIG. 9. The mounting electrical contacts 172, 174 are formed in the mounting substrate 160 prior to installation of the organic light emitting devices 200. In step 2, an adhesive 171 is applied to the organic light emitting devices 200 or to the mounting electrical contacts 172, 174. The adhesive 171 may comprise, for example, an anisotropically conductive adhesive, a metallic bump and non-conductive adhesive, or an isotropically conductive adhesive. The organic light emitting devices 200 are then mounted on the mounting substrate 160. Optionally, in step 3, a scattering layer 145 is applied. This embodiment provides the advantage that the combination of the mounting substrate 160 and mounting electrical contacts 172, 174 can be produced economically in a desired pattern, and the organic light emitting devices 200 can be mounted easily on the mounting substrate 160.

Figure 13:
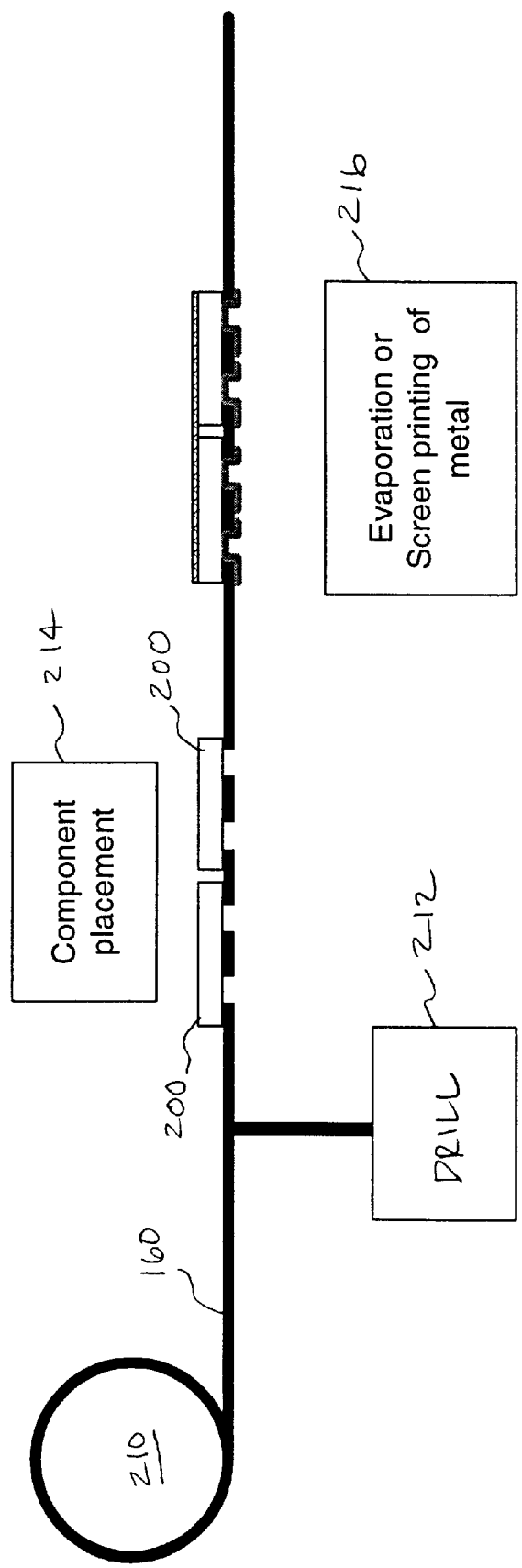

Another embodiment of the invention is shown in FIG. 13. In this embodiment, the mounting substrate 160 is provided in the form of a roll 210. The mounting substrate 160 may comprise a material such as a Kapton polyimide, or other flexible material as described above with respect to FIG. 9. The mounting substrate 160 may have a preformed adhesive layer 161 thereon. The mounting substrate 160 is unrolled at a desired rate and the vias 169 are formed with a drill 212, which may be a laser drill or a mechanical drill, for example. Other methods of forming the vias 169, such as mechanical punching, can be used. Next, the organic light emitting devices 200 are mounted with a suitable mounting apparatus 214. The mounting electrical contacts 172, 174 are then formed in a subsequent step with suitable apparatus 216, by evaporation or screen printing or other method.

Figure 10:
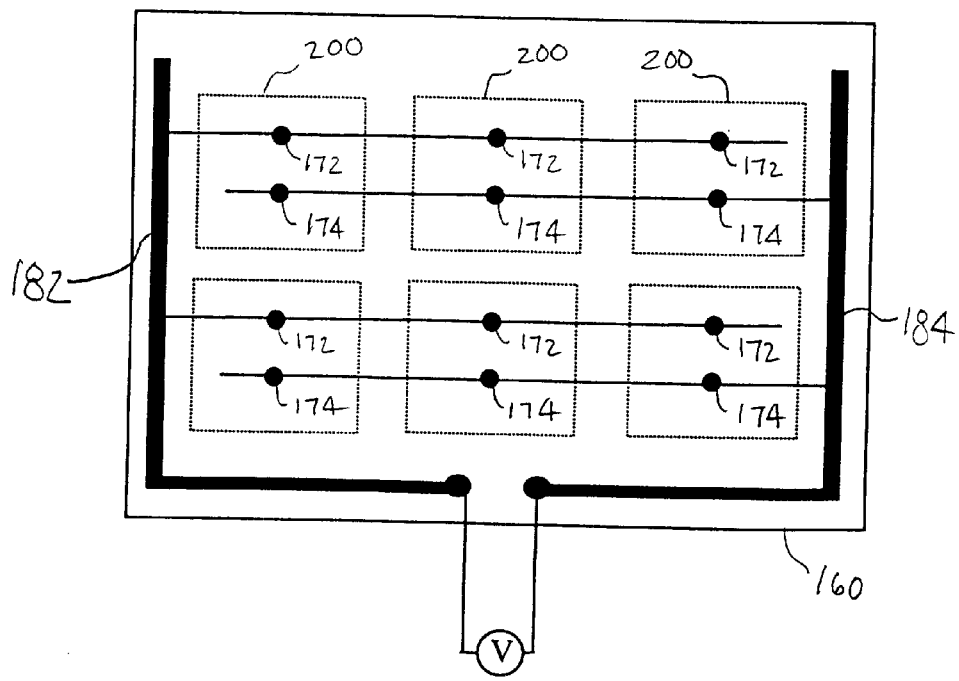
FIG. 10 is a diagram of electrical connections to a plurality of organic light emitting devices according to an exemplary embodiment of the invention.

After the mounting electrical contacts have been installed, they can be connected to a suitable power supply. FIG. 10 illustrates an example of a connection layout for six organic light emitting devices 200. The first mounting electrical contacts 172 are all connected to a first line 182 and the second mounting electrical contacts 174 are all connected to a second line 184. Upon application of a voltage, the plurality of organic light emitting devices 200 are activated. One advantage of exemplary embodiments of the invention is that the connecting structure, e.g. as shown in FIG. 10, can utilize highly conductive materials such as copper to efficiently carry power to the individual organic light emitting devices 200.

Other embodiments of the invention will be apparent to those skilled in the art from a consideration of the embodiments disclosed herein. It is intended that the specification and examples be considered as exemplary only, with the scope and spirit of the invention being defined by the following claims.

What is claimed is:

1. An organic light emitting device comprising:
   a first electrode which is light transmissive;
   a second electrode;
   an organic light emitting layer positioned between and in electrical contact with the first and second electrodes, the first and second electrodes defining a first side and a second side of the organic light emitting device, respectively, the first and second electrodes substantially and continuously covering a first surface and a second surface of the organic light emitting layer, respectively;
   a first device electrical contact extending from the first electrode to the second side of the organic light emitting device; and
   a second device electrical contact being distinct from the second electrode and extending therefrom, at least a portion of the second device electrical contact being structurally isolated from the second electrode by an electrically insulating material.

2. The organic light emitting device of claim 1, wherein the first and second device electrical contacts include first and second device contacting surfaces, respectively, which first and second device contacting surfaces occupy a common plane on the second side of the organic light emitting device.

3. The organic light emitting device of claim 1, further comprising a sealing member having first and second opposed sealing surfaces, the first sealing surface being disposed adjacent to and substantially covering the second electrode, the second sealing surface being disposed adjacent to the first and second device electrical contacts.

4. The organic light emitting device of claim 3, wherein the first and second device electrical contacts include first and second device contacting surfaces, respectively, which first and second device contacting surfaces occupy a common plane on the second side of the organic light emitting device adjacent to the sealing member.

5. The organic light emitting device of claim 1, further comprising a device substrate which is light transmissive adjacent to the first electrode.

6. An organic light emitting device comprising:
   a first electrode which is light transmissive;
   a second electrode;
   an organic light emitting layer positioned between and in electrical contact with the first and second electrodes, the first and second electrodes defining a first side and a second side of the organic light emitting device, respectively, the first and second electrodes substantially and continuously covering a first surface and a second surface of the organic light emitting layer, respectively;
   a first device electrical contact extending from the first electrode to the second side of the organic light emitting device; and
   a second device electrical contact being distinct from the second electrode and extending therefrom, at least a portion of the second device electrical contact being structurally isolated from the second electrode by an electrically insulating material;
   wherein the first and second device electrical contacts include outer exposed first and second device contacting surfaces, respectively, which outer and exposed first and second device contacting surfaces occupy a common plane.

7. The organic light emitting device of claim 6, wherein the organic light emitting layer has an imaginary surface running therethrough defining a first side and a second side of the organic light emitting device, the first electrode being on the first side of the organic light emitting device and the second electrode being on the second side of the organic light emitting device;
   wherein the first and second device contacting surfaces occupy a common plane on the second side of the organic light emitting device.

8. The organic light emitting device of claim 6, further comprising a device substrate which is light transmissive adjacent to the first electrode.

9. The organic light emitting device of claim 8, wherein the common plane is parallel to the organic light emitting layer and the device substrate.

10. A light source comprising:
    a mounting substrate;
    at least two separated organic light emitting devices mounted on the mounting substrate, each of the at least two organic light emitting devices comprising:
    a first electrode which is light transmissive;
    a second electrode;
    an organic light emitting layer positioned between and in electrical contact with the first and second electrodes, the first and second electrodes defining a first side and a second side of the organic light emitting device, respectively, the first and second electrodes substantially and continuously covering a first surface and a second surface of the organic light emitting layer, respectively;
    a first device electrical contact extending from the first electrode to the mounting substrate on the second side of the organic light emitting device; and
    a second device electrical contact being distinct from the second electrode and extending therefrom to the mounting substrate, at least a portion of the second device electrical contact being structurally isolated from the second electrode by an electrically insulating material;
    wherein the organic light emitting layer of one organic light emitting device is separated from that of another organic light emitting device.

11. The light source of claim 10, wherein the first and second device electrical contacts include first and second device contacting surfaces, respectively, which first and second device contacting surfaces occupy a common plane which interfaces with the mounting substrate.

12. The light source of claim 10, wherein the mounting substrate includes mounting electrical contacts which interface with the first and second device electrical contacts of the organic light emitting devices.

13. The light source of claim 12, wherein the mounting electrical contacts each comprise a metal coating on a via.

14. The light source of claim 13, wherein the metal coating has a through hole.

15. The light source of claim 13, wherein the metal coating does not have a through hole.

16. The light source of claim 10, wherein, for each of the at least two organic light emitting devices, the mounting substrate is on one side of the light emitting layer and the first electrode is on an opposite side of the light emitting layer.

17. The light source of claim 16, wherein each of the at least two organic light emitting devices further comprises a device substrate which is light transmissive adjacent to the first electrode.

18. The light source of claim 10, wherein each of the at least two organic light emitting devices further comprises a device substrate which is light transmissive adjacent to the first electrode;

each device substrate has a rectilinear emitting area.

19. A light source comprising:

a mounting substrate;

at least two separated organic light emitting devices mounted on the mounting substrate, each of the at least two organic light emitting devices comprising:

a first electrode which is light transmissive;

a second electrode;

an organic light emitting layer positioned between and in electrical contact with the first and second electrodes, the first and second electrodes defining a first side and a second side of the organic light emitting device, respectively, the first and second electrodes substantially and continuously covering a first surface and a second surface of the organic light emitting layer, respectively;

a device substrate which is light transmissive and is positioned adjacent to the first electrode opposite to the organic light emitting layer;

a first device electrical contact extending from the first electrode to the mounting substrate on the second side of the organic light emitting device; and a second device electrical contact being distinct from the second electrode and extending therefrom to the mounting substrate, at least a portion of the second device electrical contact being structurally isolated from the second electrode by an electrically insulating material;

wherein light generated in the organic light emitting layer propagates through the first electrode and the device substrate, the organic light emitting layer of one organic light emitting device is separated from that of another organic light emitting device, and for each of the at least two organic light emitting devices, the mounting substrate is on one side of the light emitting layer and the device substrate is on an opposite side of the light emitting layer.

20. The light source of claim 19, further comprising a layer of scattering particles which spans the gap from one device substrate to an adjacent device substrate.

21. The light source of claim 19, wherein the device substrate defines an area of the organic light emitting device, and the electrical connectors are disposed within the area of the organic light emitting device.

22. The light source of claim 19, wherein the mounting substrate is as least one of flexible, curved, or non-planar.

23. A method of making an organic light emitting device comprising the steps of:

providing a light transmissive device substrate;

forming a first electrode on the device substrate, the first electrode being light transmissive;

forming an organic light emitting layer on the first electrode, which defines a first side of the organic light emitting device, a first surface of the organic light emitting layer being adjacent to the first electrode;

forming a second electrode on a second surface of the organic light emitting layer opposite to the first electrode, the second electrode defining a second side of the organic light emitting device;

forming a first device electrical contact that extends from the first electrode to the second side of the organic light emitting device; and forming a second device electrical contact that is distinct from the second electrode and extends therefrom, at least a portion of the second device electrical contact being structurally isolated from the second electrode by an electrically insulating material.

24. The method of claim 23, further comprising the step of forming a second device electrical contact on the second electrode, wherein the first and second device electrical contacts have first and second device contacting surfaces which occupy a common plane.

* * * * *